US012648414B2

(12) United States Patent
Yu et al.

(10) Patent No.: US 12,648,414 B2
(45) Date of Patent: Jun. 2, 2026

(54) FORMING NOTCHES ON WAFER SIDEWALL FOR WAFER CUT

(71) Applicant: Taiwan Semiconductor Manufacturing Co., Ltd., Hsinchu (TW)

(72) Inventors: Chen-Hua Yu, Hsinchu (TW); Tung-Liang Shao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 482 days.

(21) Appl. No.: 18/451,890

(22) Filed: Aug. 18, 2023

(65) Prior Publication Data

US 2025/0062159 A1     Feb. 20, 2025

(51) Int. Cl.
H01L 21/30          (2006.01)
H01L 21/265         (2006.01)
(Continued)

(52) U.S. Cl.
CPC .. H01L 21/76254 (2013.01); H01L 21/26506 (2013.01); H01L 21/268 (2013.01)

(58) Field of Classification Search
CPC ............. H01L 21/76254; H01L 21/268; H01L 21/26506; H01L 21/2652; H01L 21/265; H01L 21/28123; H01L 21/3081; H01L 21/682; H01L 21/3105; H01L 21/31155; H01L 21/6836; H01L 21/68785; H01L 2221/68327; H01L 21/30608; H01L 21/3063; H01L 21/2636; H01L 21/02255; H01L 21/67098; H01L 21/02318; H01L 21/3212; H01L 21/02; H01L 23/485; H01L 25/072; H01L 21/02307; H01L 21/02337; H01L 21/02318; H01L 1121/3212; H01L 21/324; H01L 21/18; H01L 23/544; H01L 2924/0002; H01L 2223/54406; H01L 2223/54413; H01L 2223/54433; H01L 21/78; H01L 21/76259; H01L 21/02686; H01L 21/2007; H01L 2223/54453; H01L 23/08; H01L 23/10; H01L 23/481; H01L 25/167; H01L 21/02002; H01L 21/02046; H01L 21/02049; H01L 21/0475; H01L 21/67069; H01L 21/67115; H10D 30/0221; H10D 86/201; H10D 30/6758; H10D 62/00; H10D 62/116; H10D 30/0275; H10D 84/0177; H10D 30/0297; H10D 62/107; H10D 30/0411; H10D 30/031; H10D 12/461; H10D 62/822; H10D 84/401; H10D 89/10; H10D 30/0512; H10D 30/63;
(Continued)

(56) References Cited

U.S. PATENT DOCUMENTS 6,482,725 B1   11/2002 Ishida
2011/0244655 A1 * 10/2011 Akiyama .......... H01L 21/76254
                                              257/E21.211

* cited by examiner

*Primary Examiner* — Niki H Nguyen
(74) *Attorney, Agent, or Firm* — Slater Matsil, LLP

(57) ABSTRACT

A method includes implanting a substrate with a dopant to form an implanted layer in the substrate, and the implanted layer is at an intermediate level between a top surface and a bottom surface of the substrate. A laser beam is projected on the implanted layer, and is projected on a sidewall of the substrate. After the laser beam is projected, the substrate is heated, so that the substrate is cut at the implanted layer, and is cut into a top portion and a bottom portion.

20 Claims, 12 Drawing Sheets

(51) Int. Cl.
  *H01L 21/268*        (2006.01)
  *H01L 21/46*         (2006.01)
  *H01L 21/762*        (2006.01)
(58) Field of Classification Search
  CPC ........... H10D 30/6728; H10D 62/8325; H10D
            84/0158; H10D 84/834; H10D 84/853;
            H10D 84/85; H10D 86/215; H10D
            30/021; H10D 30/026; H10D 30/637;
            H10D 30/6715; H10D 30/6893; H10D
                                    30/69
  See application file for complete search history.

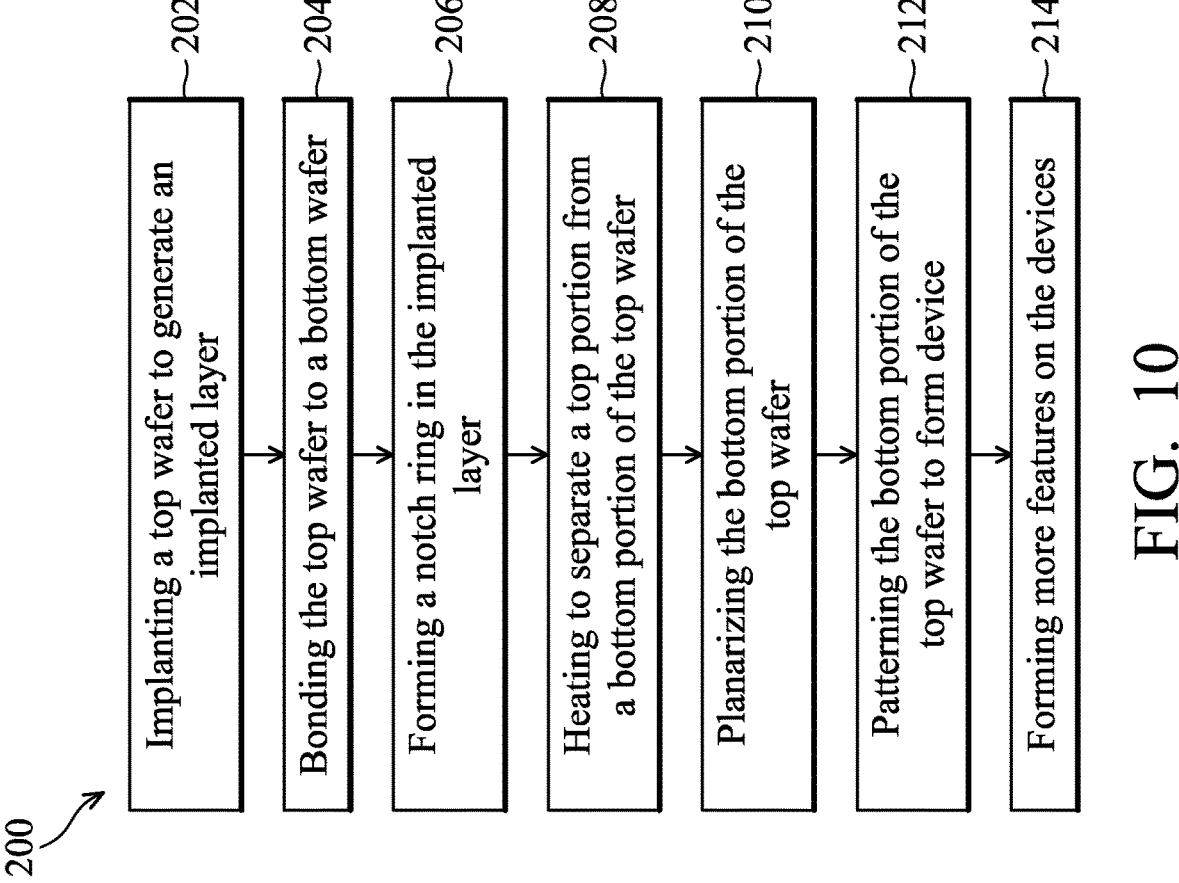

200

Implanting a top wafer to generate an implanted layer ⟍202

Bonding the top wafer to a bottom wafer ⟍204

Forming a notch ring in the implanted layer ⟍206

Heating to separate a top portion from a bottom portion of the top wafer ⟍208

Planarizing the bottom portion of the top wafer ⟍210

Patterning the bottom portion of the top wafer to form device ⟍212

Forming more features on the devices ⟍214

FIG. 10

FORMING NOTCHES ON WAFER SIDEWALL FOR WAFER CUT

BACKGROUND

Semiconductor wafers may be thinned in some manufacturing processes. The thinning process may be performed through Chemical Mechanical Polish (CMP) processes or mechanical grinding processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 illustrates a process flow for a wafer cutting process in accordance with some embodiments of the present disclosure.

DETAILED DESCRIPTION

Figure 1:
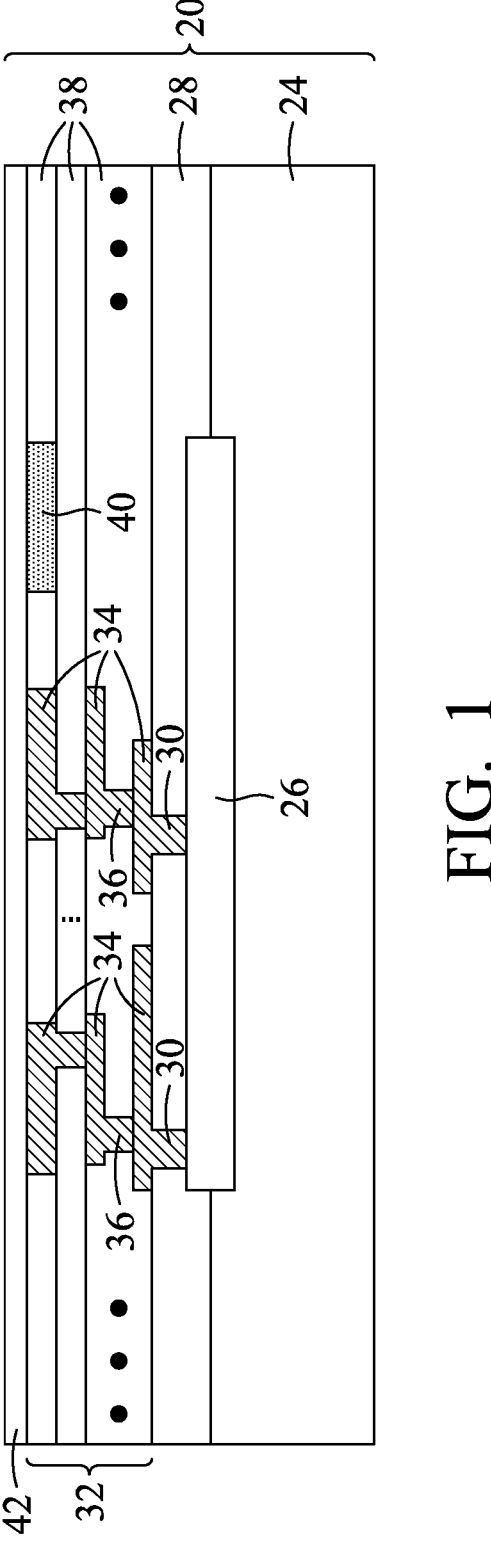
FIGS. 1-3, 4A, 4B, 4C and 5-8 illustrate the cross-sectional views of intermediate stages in a wafer cutting process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer cutting process is provided. In accordance with some embodiments of the present disclosure, a top wafer is bonded to a bottom wafer. A dopant is implanted into a portion of the top wafer to form an implanted layer, which is at an intermediate level of the wafer. A stress concentration region is generated around the wafer edge region. The stress concentration region may be generated using laser. The stress concentration region may include a notch in accordance with some embodiments. The stress concentration region may also be generated using a blade. The wafer is then cut by heating the wafer, wherein defects are generated in the implanted region, so that wafer is cut at the implanted region. In the heating process, cracks are formed in the stress concentration region, and the cracks propagate throughout the entire implanted region. Accordingly, the wafer cutting process is easier and more precise.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-3, 4A, 4B, 4C and 5-8 illustrate the cross-sectional views of intermediate stages in a wafer cutting process in accordance with some embodiments of the present disclosure. The corresponding processes are also reflected schematically in the process flow shown in FIG. 10.

FIG. 1 illustrates a cross-sectional view of package component 20. In accordance with some embodiments of the present disclosure, package component 20 is or comprises a wafer including active devices and possibly passive devices, which are represented as integrated circuit devices 26. For example, package component 20 may be or may comprise an electronic wafer including electronic dies therein, and the electronic dies may be used for forming or bonding to a photonic die including photonic devices in accordance with some embodiments of the present disclosure. In accordance with alternative embodiments, package component 20 is or comprises a photonic wafer, which includes photonic dies therein, and the photonic dies may also be used for forming photonic engines in accordance with some embodiments of the present disclosure. The photonic dies or wafer may include photonic devices such as waveguides, grating couplers, photodiodes, modulators, and/or the like.

In accordance with alternative embodiments, package component 20 is an interposer wafer, which is free from active devices, and may or may not include passive devices. In accordance with yet alternative embodiments, package component 20 is or comprises a package such as an Integrated Fan-Out (InFO) Package. For example, package component 20 may be a reconstructed wafer, which includes device dies and/or a wafer(s) bonded together and encapsulated in an encapsulant(s) such as a molding compound. Package component 20 may also be a silicon carrier, which is free from metal features and active devices therein.

In subsequent discussion, a device wafer (which may include electronic devices and/or photonic devices) is used as an example of package component 20, and package component 20 may also be referred to as bottom wafer 20. The embodiments may also be applied on interposer wafers, reconstructed wafers, discrete packages, discrete device dies, discrete interposer dies, etc.

Package component 20 may include a plurality of dies therein, with some features of one of dies being illustrated. In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, crystalline silicon germanium, carbon-doped silicon, a III-V compound semiconductor, or the like. Semiconductor substrate 24 may also be a bulk semiconductor substrate or a Semiconductor-On-Insulator (SOI) substrate.

In accordance with some embodiments of the present disclosure, wafer 20 includes integrated circuit devices 26, which are formed at the top surface of semiconductor substrate 24. Integrated circuit devices 26 may include Complementary Metal-Oxide Semiconductor (CMOS) transistors, resistors, capacitors, diodes, and/or the like in accordance with some embodiments of the present disclosure. The details of integrated circuit devices 26 are not illustrated herein.

Inter-Layer Dielectric (ILD) 28 is formed over semiconductor substrate 24 and fills the spaces between the gate stacks of transistors (not shown) in integrated circuit devices 26. In accordance with some embodiments of the present disclosure, ILD 28 is formed of or comprises Phospho Silicate Glass (PSG), Boro Silicate Glass (BSG), Boron-doped Phospho Silicate Glass (BPSG), Fluorine-doped Silicate Glass (FSG), silicon oxide, silicon oxynitride, silicon nitride, or the like. ILD 28 may be formed using spin-on coating, Flowable Chemical Vapor Deposition (FCVD), Chemical Vapor Deposition (CVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys therefore, and/or multi-layers thereof.

Interconnect structure 32 is formed over ILD 28 and contact plugs 30. Interconnect structure 32 may include metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers interconnected through vias 36. Metal lines 34 and vias 36 may be formed of copper, a copper alloy, and/or another metal. In accordance with some embodiments of the present disclosure, dielectric layers 38 are formed of low-k dielectric materials. The dielectric constants (k values) of the low-k dielectric materials may be lower than about 3.5, for example. Dielectric layers 38 may comprise a carbon-containing low-k dielectric material, Hydrogen SilsesQuioxane (HSQ), MethylSilsesQuioxane (MSQ), or the like.

Interconnect structure 32 may also include a passivation layer, which may be formed of a non-low-k dielectric material, over the low-k dielectric layers. The passivation layer may be formed of or comprise Undoped Silicate Glass (USG), silicon nitride, silicon oxide, or the like, or multi-layers thereof. There may also be metal pads (such as aluminum-copper pads), Post Passivation Interconnect (PPI), metal pads, or the like, which are referred to as conductive features.

FIG. 1 also illustrates a photonic device 40 in accordance with some embodiments of the present disclosure, which represents a plurality of photonic devices 40 that may be formed in bottom wafer 20. Also, photonic device 40 may also be formed throughout a plurality of dielectric layers in bottom wafer 20. Photonic device 40 may include waveguides (such as silicon waveguides and/or silicon nitride waveguides), grating couplers, modulators, and/or the like in accordance with some embodiments. In accordance with alternative embodiments, bottom wafer 20 may be free from the photonic devices.

Further referring to FIG. 1, bond film 42 is deposited over interconnect structure 32. The top surface of bond film 42 is coplanar. Bond film 42 may be a blanket dielectric layer that is free from conductive features (such as conductive lines and conductive pads) therein. Alternatively, bond film 42 may include bond pads therein. In accordance with some embodiments of the present disclosure, an entire bond film 42 is a homogeneous layer having a uniform composition. Throughout the description, when two features (such as two layers) are referred to as having the same composition, it means that the two features have same types of elements, and the percentages of the corresponding elements in these two features are the same as each other. Conversely, when two features are referred to as having different compositions, it means that one of the two features either has at least one element not in the other feature, or the two features have the same elements, but the percentages of the elements in two features are different from each other.

In accordance with some embodiments of the present disclosure, bond film 42 may be formed of a silicon-base dielectric material, which may comprise one or more of oxygen, carbon, and nitrogen. In accordance with other embodiments, depending on the material of the top wafer that is to be bonded to bottom wafer 20, the material of bond film 42 may be another material other than the silicon-containing dielectric materials.

Bond film 42, when formed of the silicon-base dielectric material, may be expressed as $SiO_xN_yC_z$, with x being in the range between about 0 and about 2, y being in the range between about 0 and about 1.33, and z being in the range between about 0 and about 1, and x, y, and z will not be all equal to zero. For example, bond film 42 may be formed of or comprises SiON, SiN, SiOCN, SiCN, SiOC, SiC, or the like. Bond film 42 may be transparent to light in accordance with some embodiments of the present disclosure.

Figure 2:
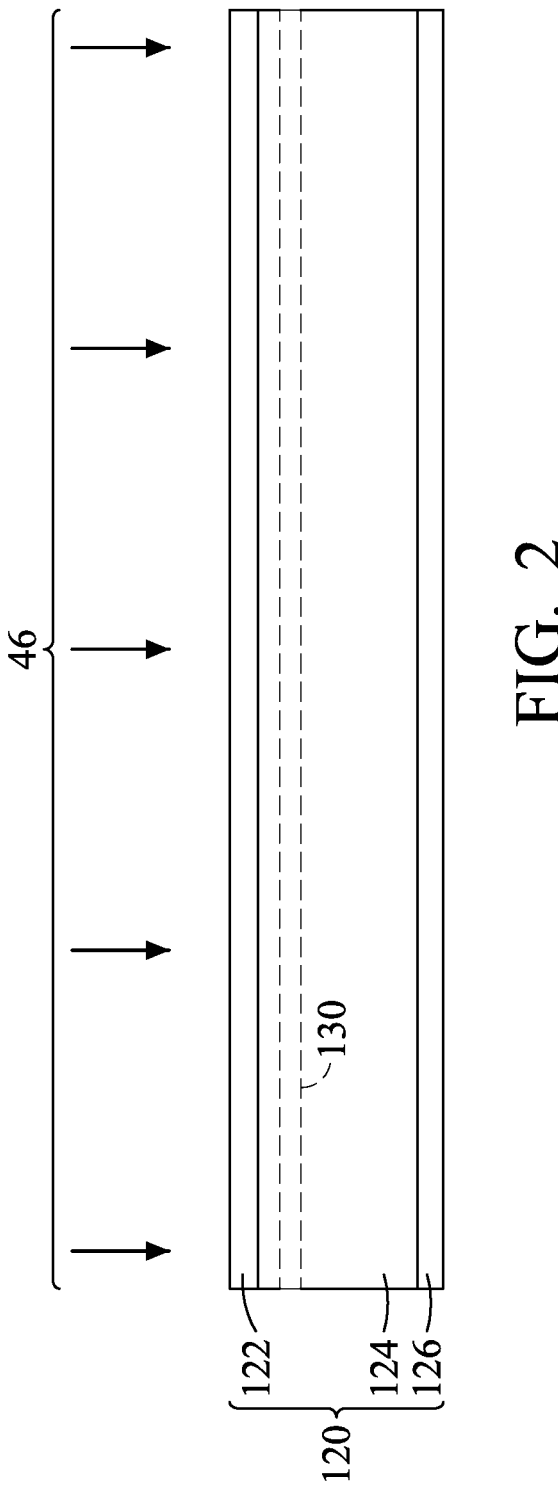

FIG. 2 illustrates top wafer 120 in accordance with some embodiments of the present disclosure. Top wafer 120 may be a device wafer, which may include integrated circuits therein, and may include transistors, resistors, diodes, capacitors, and/or the like. In accordance with some embodiments, top wafer 120 may include a semiconductor substrate, with the back surface of the semiconductor substrate facing up. The integrated circuits may be formed at the bottom surface of the semiconductor substrate. There may be, or may not be, through-vias (also referred to as through-silicon vias or through-semiconductor vias, not shown) extending from the bottom of the semiconductor substrate up to an intermediate level between the top surface and the bottom surface of the semiconductor substrate. In accordance with some embodiments, the semiconductor substrate may comprise silicon.

In accordance with alternative embodiments, top wafer 120 may be a blanket wafer free from active devices and passive devices therein. Top wafer 120 includes substrate 124, and may or may not include bond film 122, which is dielectric layer 122, at the top of top wafer 120.

In subsequently discussed example embodiments, substrate 124 comprises a material that may be used for forming photonic devices such as waveguides, grating couplers, modulators, and/or the like. For example, substrate 124 may be formed of or comprise silicon, lithium niobate ($LiNbO_3$), or the like. Substrate 124 may have a single crystalline structure in accordance with some embodiments.

In accordance with some embodiments, dielectric layer 122 is formed on the top surface of substrate 124. In accordance with some embodiments, dielectric layer 122 is formed of a material that may form strong bonds with bond film 42 (FIG. 1). Dielectric layer 122 is referred to as bond film 122 hereinafter. In accordance with some embodiments, bond film 122 is formed of or comprises a silicon-base dielectric material, which may also be expressed as $SiO_xN_yC_z$, with x being in the range between about 0 and about 2, y being in the range between about 0 and about 1.33, and z being in the range between about 0 and about 1, and x, y, and z will not be all equal to zero. For example, bond film 122 may be formed of or comprises SiON, SiN, SiOCN, SiCN, SiOC, SiC, or the like.

Bond film 122 may be transparent to light in accordance with some embodiments of the present disclosure. Bond film 122 may be formed through a deposition process such as Atomic Layer Deposition (ALD), Physical Vapor Deposition (PVD), Chemical Vapor Deposition (CVD), or the like. In accordance with alternative embodiments, bond film 122 is not formed, and substrate 124 may be bonded to bond film 42 directly in the subsequent bonding process.

In accordance with some embodiments in which top wafer 120 includes the homogeneous substrate 124 and does not include other layers, dielectric layer 126 may also be formed, and may be formed in the same formation process as the formation of bond film 122. For example, bond film 122 and dielectric layer 126 may be formed through oxidation, nitriding, and/or the like.

Further referring to FIG. 2, an implantation process is performed to implant a dopant into substrate 124. The respective process is illustrated as process 202 in the process flow 200 as shown in FIG. 10. The dopant may include hydrogen ions, helium ions, or the like. The dopant is implanted to an intermediate level between the top surface and the bottom surface of substrate 124, and is implanted to a position where wafer 120 is to be cut. The implanted dopant is concentrated in an intermediate level of substrate 124 to form implanted layer 130. The dopant may be selected based on the material of substrate 124. For example, hydrogen may be selected when substrate 124 comprises silicon, and helium may be selected when substrate 124 comprises lithium niobate.

Figure 3:
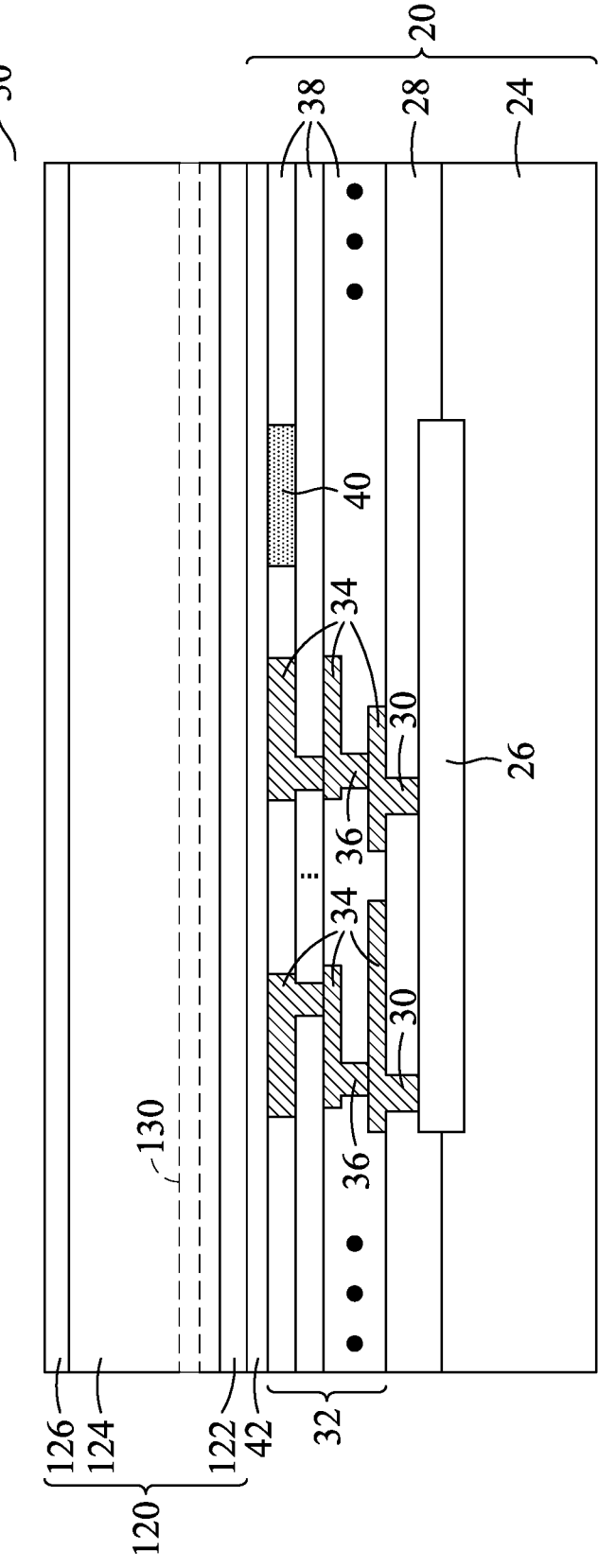

Next, referring to FIG. 3, top wafer 120 is flipped upside down, and is bonded to bottom wafer 20 through wafer-on-wafer bonding, so that composite wafer 50 is formed. The respective process is illustrated as process 204 in the process flow 200 as shown in FIG. 10. The bonding may include a pre-bonding process, in which a center point of top wafer 120 is put into contact with a center point of bottom wafer 20, and the contacting propagates to the entirety of top wafer 120 and bottom wafer 20. An anneal process may then be performed to bond top wafer 120 to bottom wafer 20. When bond film 122 is formed, bond film 122 is bonded to bond film 42. Otherwise, when bond film 122 is not formed, substrate 124 may be bonded to bond film 42 directly.

In accordance with some embodiments, as shown in FIGS. 2 and 3, top wafer 120 is implanted to form implanted layer 130 first, and then the implanted top wafer 120 is bonded to bottom wafer 20. In accordance with alternative embodiments, top wafer 120 is bonded to bottom wafer 20, and then implantation process 46 is performed to form the implanted layer 130 in the top wafer 120.

Figure 4A:
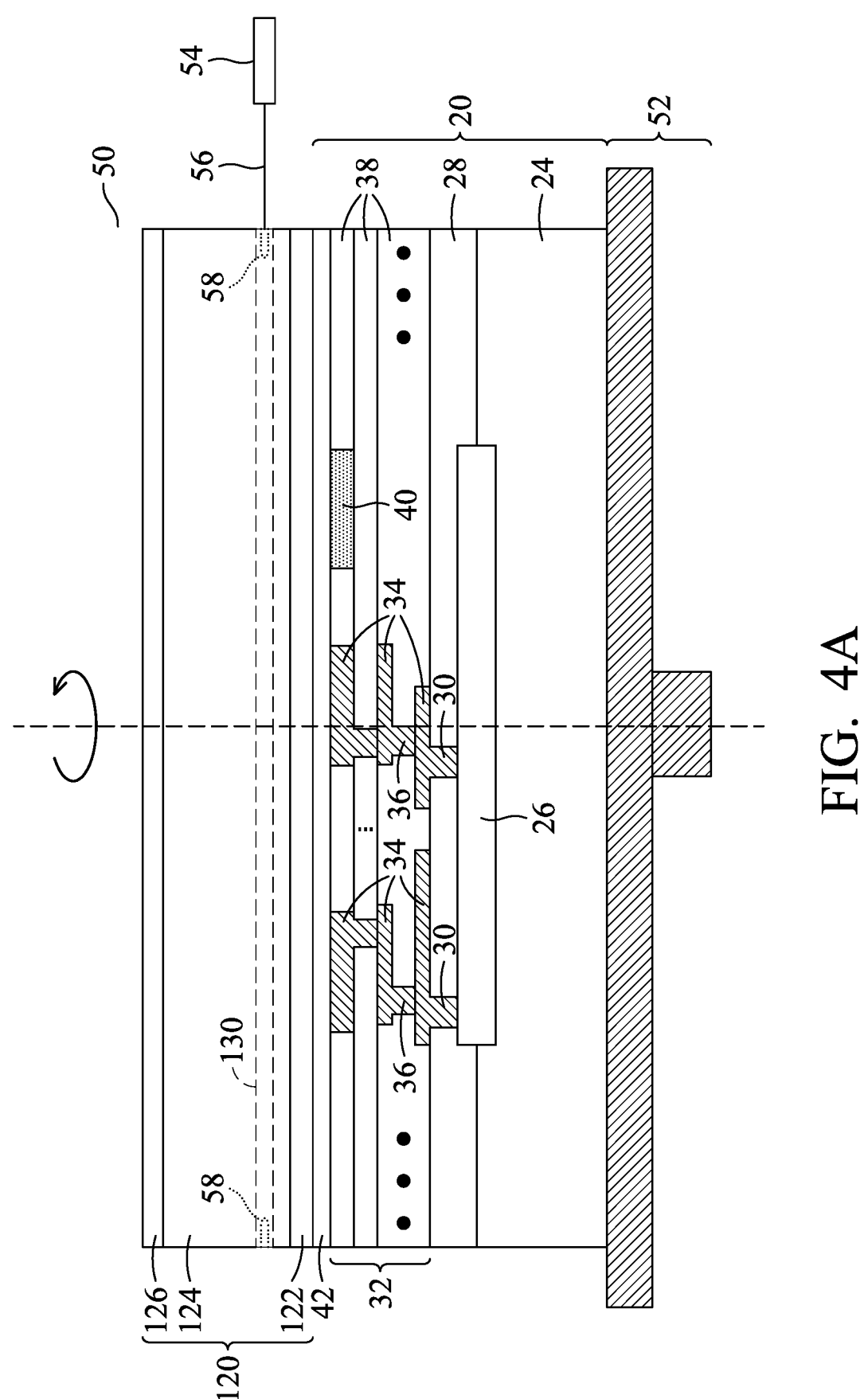

Referring to FIG. 4A, composite wafer 50 is placed on a rotational chuck stage 52. The rotation center is also aligned to the centers of top wafer 120 and bottom wafer 20. Rotational chuck stage 52 is used to rotate composite wafer 50, with composite wafer 50 having no vertical vibration during its rotation. Alternatively stated, when composite wafer 50 is rotated, the entire top surface of top wafer 120 is maintained at the same level without up-and-down movement.

Composite wafer 50 is rotated around the center. In accordance with some embodiments, laser beam generator 54 is used to generate laser beam 56, which is projected on the sidewall of top wafer 120. Also, laser beam 56 is projected on the implanted layer 130. At the same time laser beam 56 is projected on the implanted layer 130, composite wafer 50 is rotated. In accordance with some embodiments, laser beam generator 54 is fixed in position, and is not moved when projecting laser beam 56 on top wafer 120.

Laser beam 56 heats the projected region, and may generate a stress concentrated region 58 in the implanted layer 130. With the composite wafer 50 being rotated, the stress concentrated region 58 forms a ring in the peripheral of top wafer 120. The illustrated stress concentrated regions 58 on the left side and the right side of top wafer 120 are in the cross-section that cuts through the center of top wafer 120. Since composite wafer 50 has no vertical vibration in the rotation, the ring is in a plane that is parallel to the bond interface between bottom wafer 20 and top wafer 120.

Figure 4B:
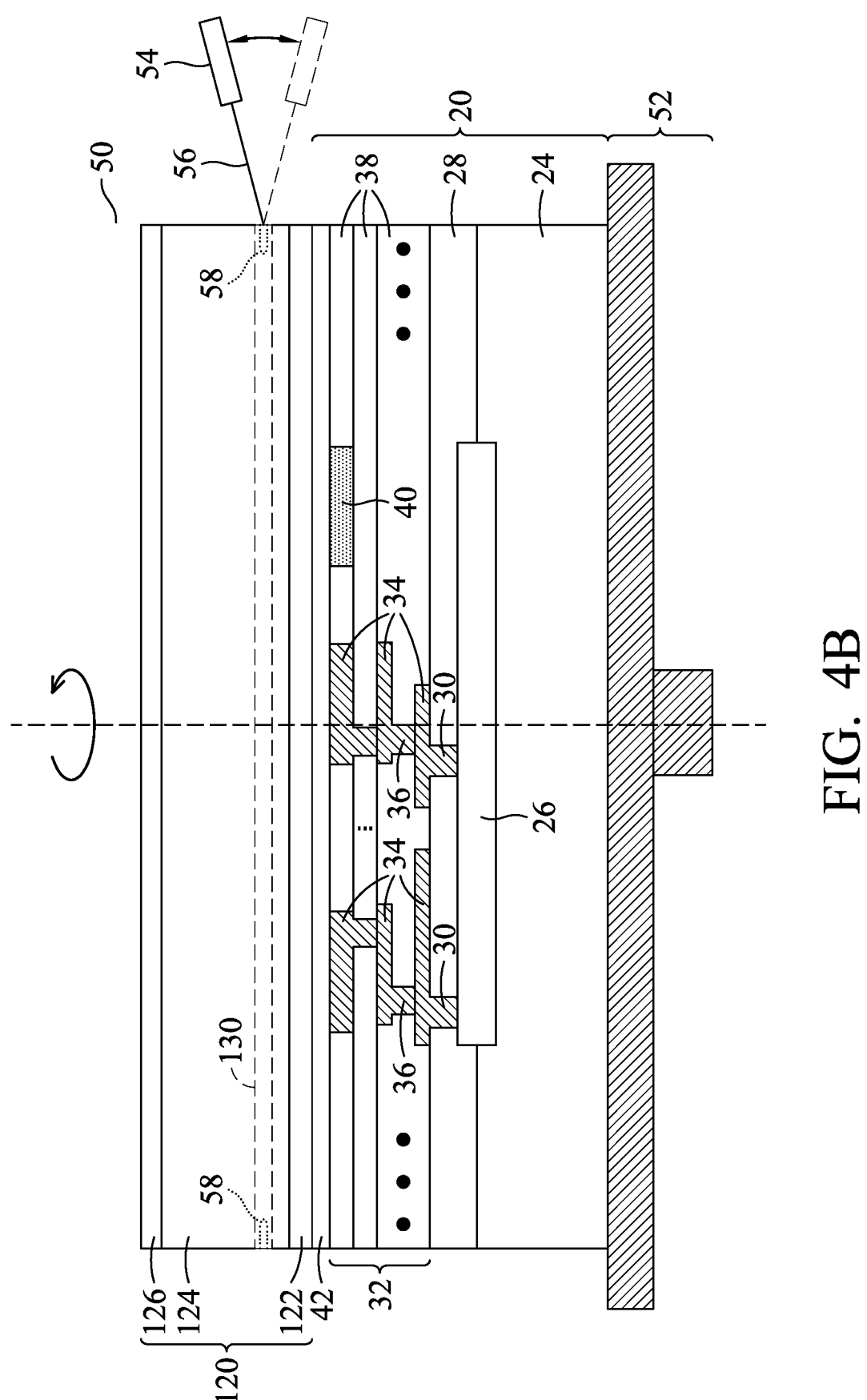

In accordance with some embodiments, as shown in FIG. 4A, laser beam 56 is projected in a direction that is parallel to the plane of the bond interface between bottom wafer 20 and top wafer 120. In accordance with alternative embodiments, as shown in FIG. 4B, laser beam 56 is projected in a direction that forms an acute angle with the interface between bottom wafer 20 and top wafer 120. In accordance with yet alternative embodiments, the laser beam generator 54 may rotate as illustrated. When laser beam generator 54 is rotated, the laser beam 54 may be projected on the same spot, or, alternatively, when laser beam 54 is rotated down, the projecting spot on top wafer 120 is shifted down slightly. This may help to generate a notch with a triangular cross-sectional shape.

Figure 5:
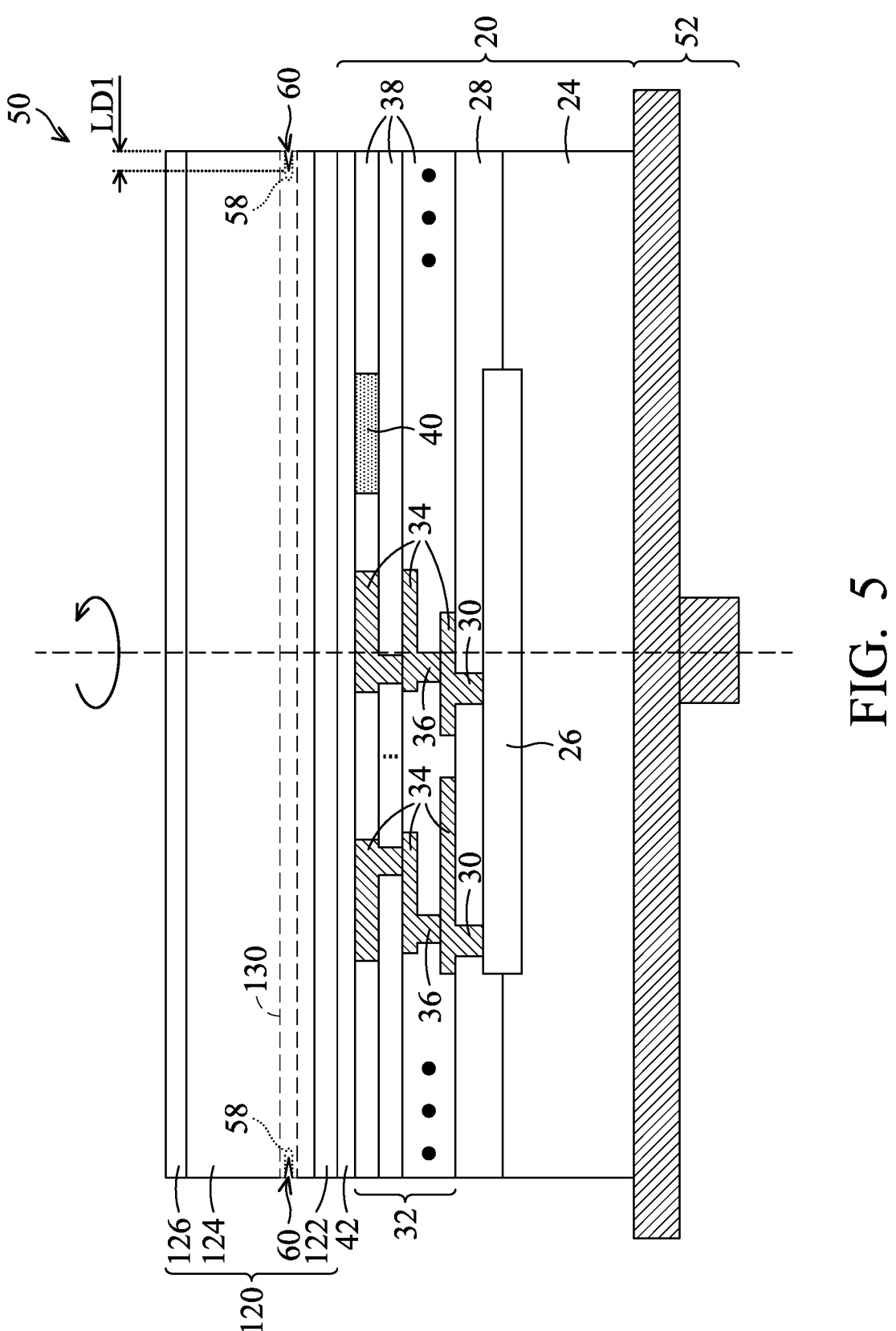

Referring to FIG. 5, notch 60 is formed by the heat of laser beam 56. The respective process is illustrated as process 206 in the process flow 200 as shown in FIG. 10. Notch 60 is formed as a ring extending from the sidewall of top wafer 120 inwardly. In accordance with some embodiments, notch 60 has a triangular cross-sectional shape with a tip pointing to the notch 60 on the other side. The tip also forms a ring. The tip is where the stress concentrates, and is also where the crack is mostly like to occur first. Accordingly, with the tip being generated and the tip ring being at the same level, the position of the subsequently formed crack is accurately determined.

In accordance with some embodiments, the notch 60 is generated as a ring due to the rotation of composite wafer 50. In accordance with some embodiments, the rotation of composite wafer 50 is at a low speed. Accordingly, notch 60 is generated when composite wafer 50 is rotated. When top wafer 120 is rotated for a full round, a notch ring, which is also referred to using reference notation 60, is formed. The composite wafer 50 may be continued to be rotated and burned by laser beam 54, and the notched 60 may be enlarged in subsequent rounds of rotations. In accordance with some embodiments, when notch 60 finishes formation, the lateral depth LD1 may be greater than 1 µm, and may be in the range between about 10 µm and about 500 µm.

In accordance with alternative embodiments, composite wafer 50 is rotated at a high speed. Accordingly, in one round of rotation, the projected portions of top wafer 120 is heated, but has no notch being formed in the first round. With the continued rotation of top wafer 120, the temperature of the projected regions increases, and eventually, notch 60 is formed. Notch 60 is also enlarged in subsequent rotations of top wafer 120.

Figure 4C:
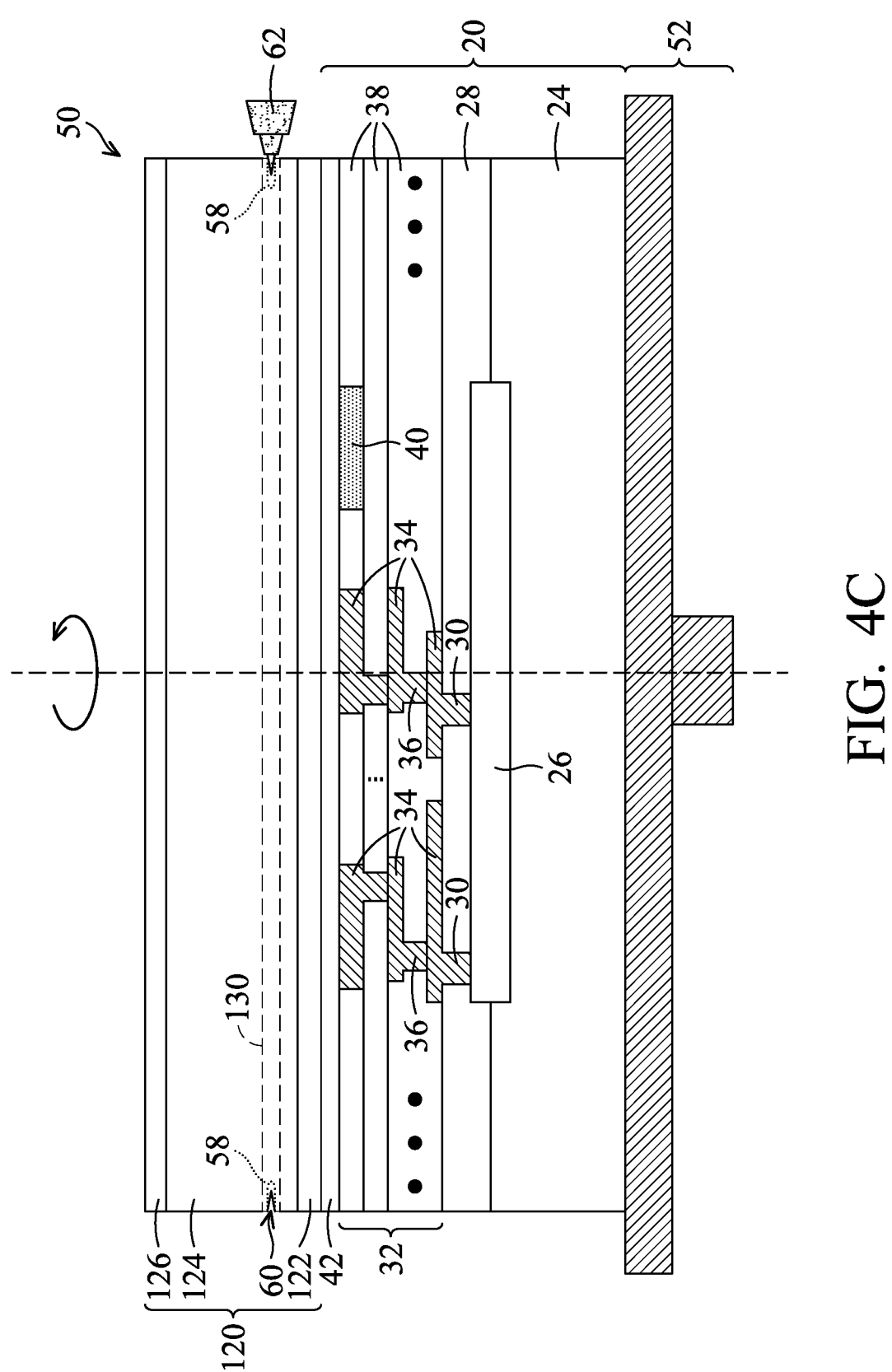

In accordance with alternative embodiments, instead of being formed using laser beam 54, notch 60 is formed through mechanical cutting processes. For example, as shown in FIG. 4C, blade 62 may be used to cut into top wafer 120 from side to form notch 60. At the time when blade 62 cuts into the side of top wafer 120, top wafer 120 is also rotated, and hence notch 60 also forms a ring. In accordance with some embodiments, the portion of blade 62 cutting into top wafer 120 has a triangular shape, so that the resulting notch 60 also has a triangular cross-sectional view.

In accordance with yet alternative embodiments, instead of forming a notch ring, laser beam 54 is used to generate stress concentrated region 58, which is shown in FIG. 4A. In accordance with these embodiments, at the time the composite wafer 50 is heated to cut top wafer 120, as discussed in subsequent paragraphs, no notch is formed in the implanted layer 130. Stress concentrated region 58 is thus a burned region (burned ring), and is an un-cut part of top wafer 120. The sidewall of the top wafer 120 thus may remain as being straight or curved, same as prior to receiving the laser beam 56.

Figure 6:
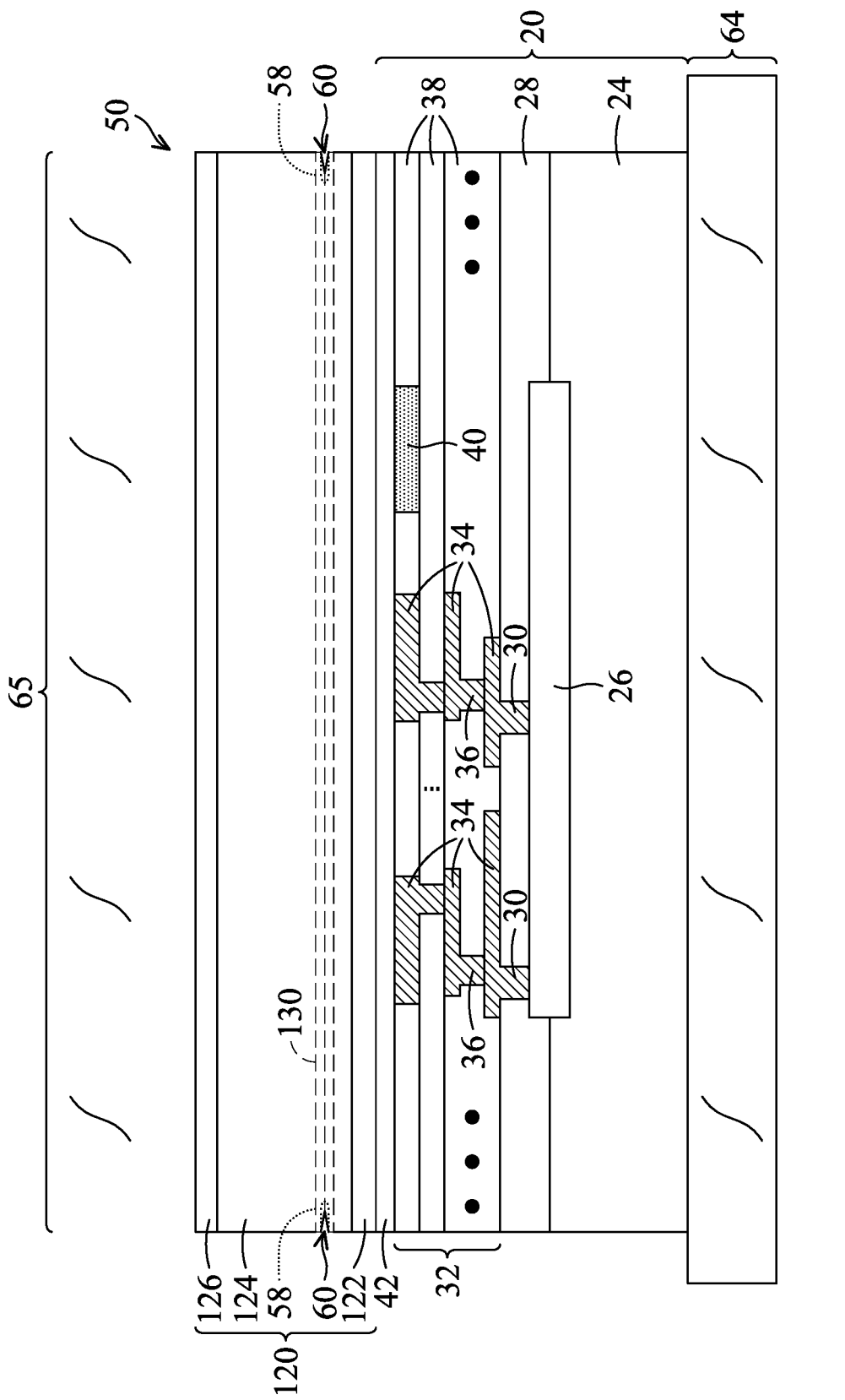

Referring to FIG. 6, composite wafer 50 is heated to perform a cutting process, so that top wafer 120 is separated as a top portion and a bottom portion. The respective process is illustrated as process 208 in the process flow 200 as shown in FIG. 10. In accordance with some embodiments, composite wafer 50 is moved to a heating unit 64, which heats composite wafer 50 from bottom. In accordance with alternative embodiments, composite wafer 50 is heated from top, for example, through radiation 65 generated by a heat source (such as a lamp), or from top and bottom at the same time. In accordance with some embodiments, during the heating process, the top wafer 120 is heated to a temperature in a range between about 200° C. and about 300° C. The heating duration may be in the range between about 0.5 hours and about 10 hours, depending on the material of substrate 124, the concentration of the implanted dopant, and the like.

Figure 7:
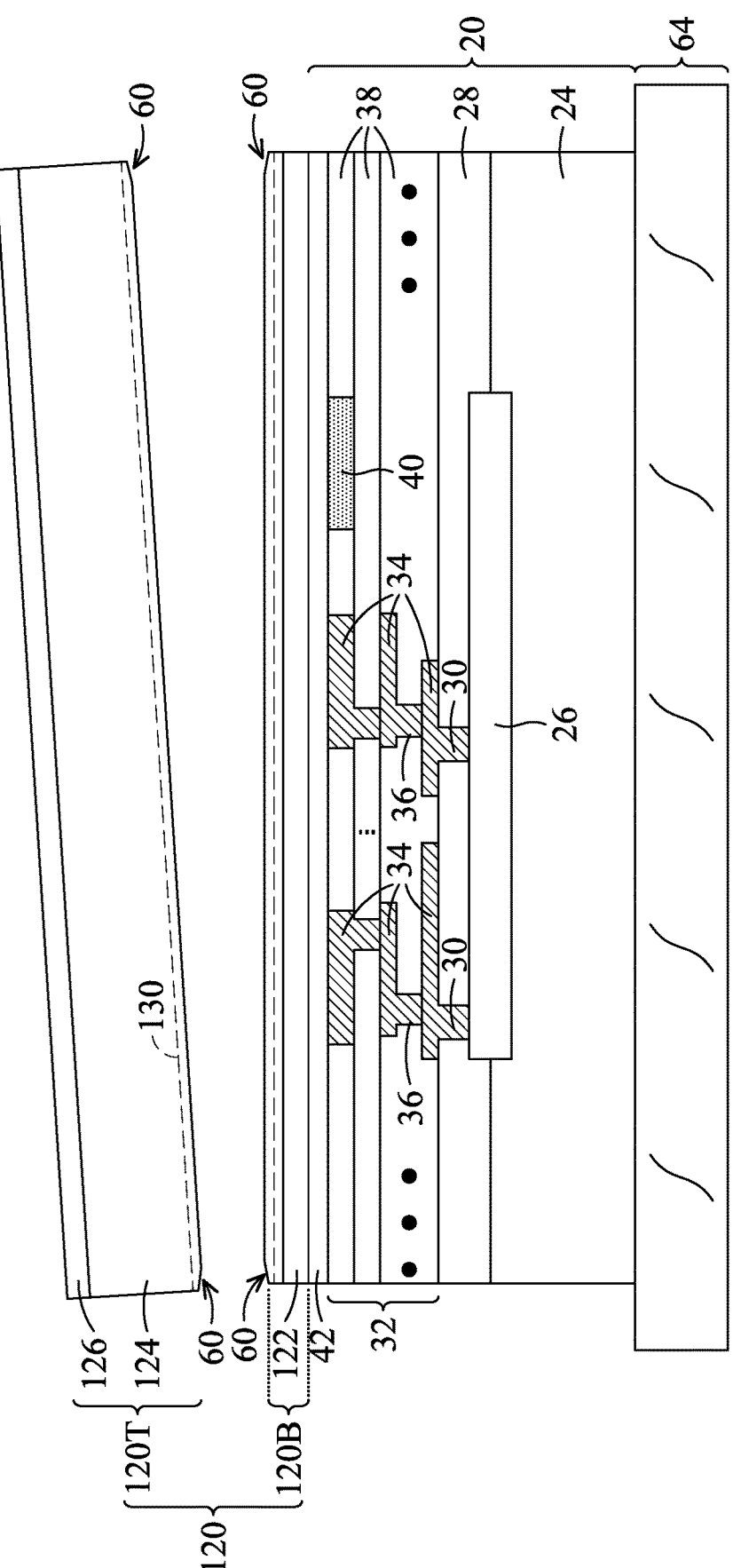

With the proceeding of the heating process, cracks are generated where stress is concentrated. The implanted layer 130 is where the substrate 124 is weakened and where stress is more concentrated. In addition, due to the formation of stress concentration regions, it is easier (with less time and/or lower temperature) to have cracks generated and propagated. In accordance with some embodiments, with the formation of notch ring 60, cracks are generated extending from notch ring 60, and propagate along the implanted layer 130 inwardly, until the cracks propagated starting from notch ring 60 meet, and the top portion of top wafer 120 is separated from the bottom portion, as shown in FIG. 7. In accordance with some embodiments in which notch 60 has a sharp tip, for example, when notch 60 has a triangular cross-section shape, the cracks will propagate from the tips of notch rings. Accordingly, the position where the wafer cut occurs is accurately controlled.

In accordance with alternative embodiments, as discussed referring to FIG. 4A, stress concentration regions 58 are formed as a ring using laser beam 56, while no notch is formed in the regions of top wafer 120 with laser beam 56 projected on. In the subsequent heating process as shown in FIG. 6, the cracks will also be generated from the stress concentration regions 58, which are also in the weakened implanted layer 130. The cracks propagate along implanted layer 130 to separate the top portion from the bottom portion of top wafer 120.

FIG. 7 illustrates the structure after the wafer cut process, wherein the top portion 120T of the top wafer 120 is separate from the bottom portion 120B. In accordance with some embodiments in which notch 60 is formed, notch 60 is separated into the top wafer portion 120T and bottom wafer portion 120B. Accordingly, the edge portions of the top wafer portion 120T and bottom wafer portion 120B have recesses. For example, at the edge portions of the top wafer portion 120T, there may be a small slant bottom surface, and at the edge portions of the bottom wafer portion 120B, there may be a small slant top surface.

Figure 9:
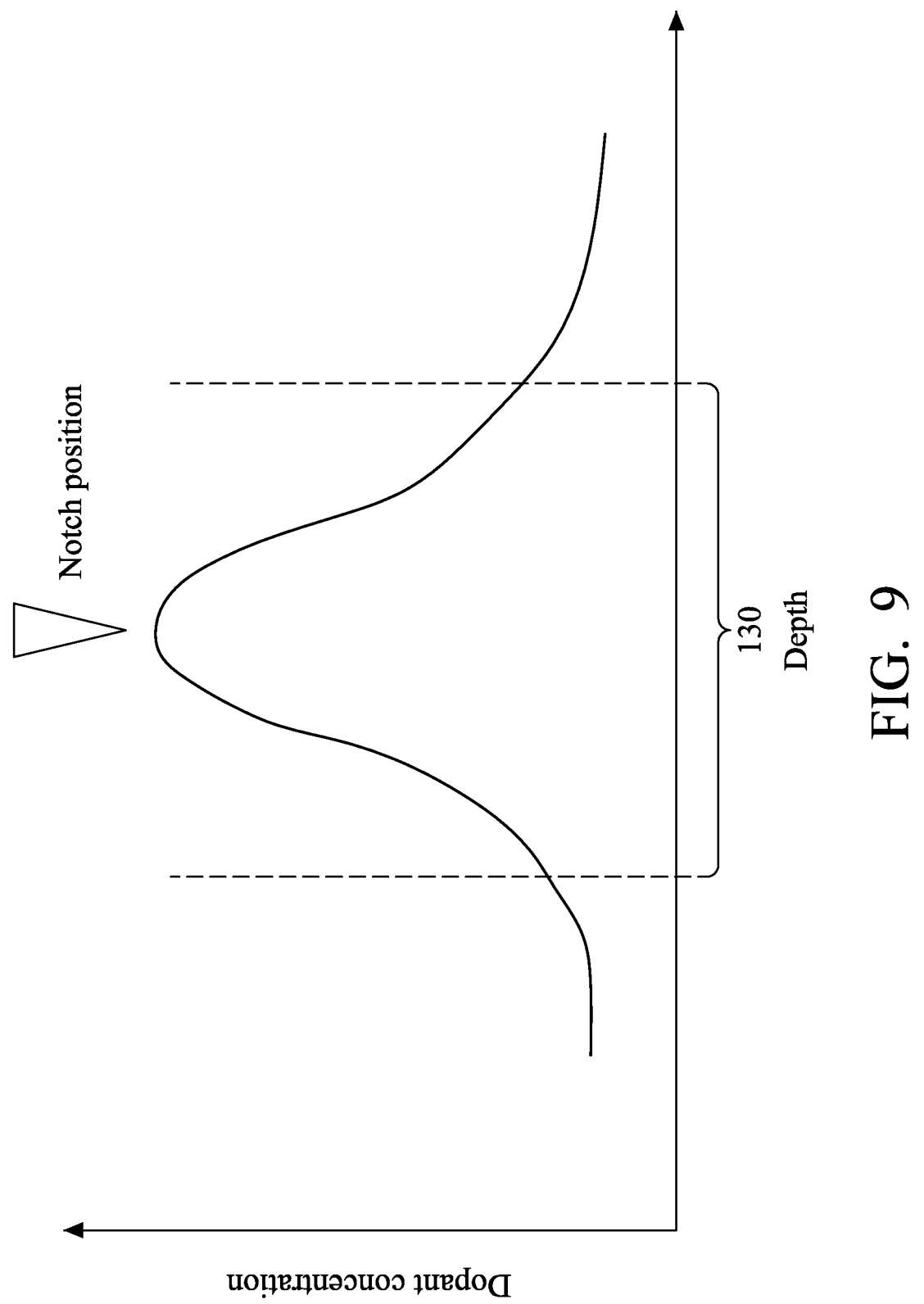
FIG. 9 illustrates the distribution of the implanted dopant and the position of a notch in accordance with some embodiments.

FIG. 9 schematically illustrates the dopant concentration profile of the implanted dopant as a function of depth, wherein the depth is measured from a top surface of top wafer 120 downwardly. It is appreciated that the dopant concentration in the implanted region 130 has a certain distribution, with the dopant concentration being highest at position close to or at the middle level of the implanted layer 130. The dopant concentration gradually reduces in positions away from where the dopant concentration is highest. In accordance with some embodiments, the notch 60 in FIG. 5 (or the stress concentration region 58 in FIGS. 4A and 4B) is aligned to where the dopant concentration is highest. For example, when notch 60 has a tip, the tip is aligned to where the dopant concentration is highest, which is also where substrate 124 has the weakest structure. As a result, the cracks formed starting from the notch 60 or the stress concentration region 58 will be less likely to deviate upwardly and downwardly, and the top surface of the bottom portion 120B (FIG. 7) is more planar.

Figure 8:
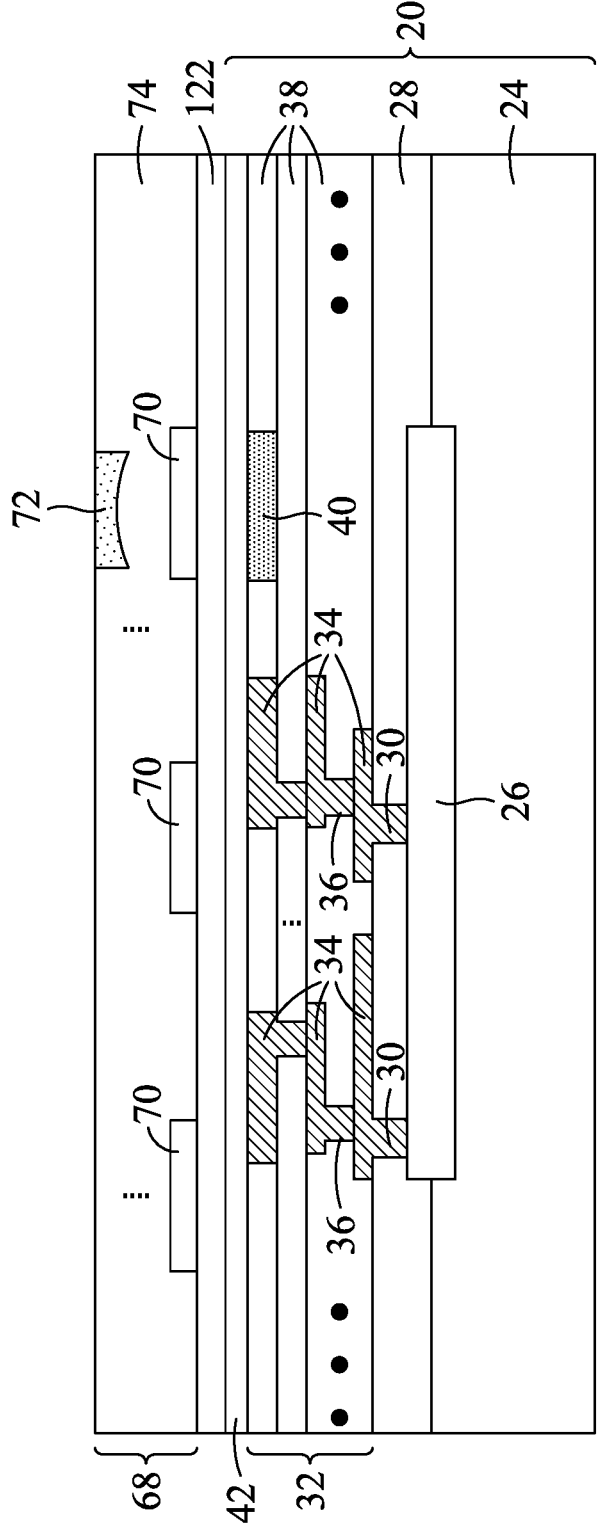

FIG. 8 schematically illustrates more features 68 formed based on the structure shown in FIG. 7. For example, the bottom portion 120B in FIG. 7 may be planarized to have a planar surface. The respective process is illustrated as process 210 in the process flow 200 as shown in FIG. 10. The planarization process may include a Chemical Mechanical Polish (CMP) process or a mechanical grinding process. The planarized bottom portion 120B may then be patterned to form a plurality of photonic devices 70, which may include grating couplers, waveguides, modulators, and/or the like. The respective process is illustrated as process 212 in the process flow 200 as shown in FIG. 10. The photonic devices may be silicon-based devices, lithium niobate based devices, or the like. More features may be formed over photonic devices 134. The respective process is illustrated as process 214 in the process flow 200 as shown in FIG. 10. In accordance with some embodiments, a plurality of transparent dielectric layers 74, nitride waveguides (not shown), micro-lens 72, etc., are formed.

It is appreciated that although the cutting of wafer to form photonic devices is used as an example, the embodiments may be applied to the wafer cutting of any other structure whenever applicable. For example, when two device wafers are bonded, with one device wafer include TSVs, the semiconductor substrate having the TSVs therein may be cut using the embodiments of the present disclosure, followed by a thinning process to reveal TSVs.

The embodiments of the present disclosure have some advantageous features. By forming stress concentrated regions such as notches in an implanted layer of a wafer, cracks may be generated starting from the notches, and the wafer cutting process is more precise. Furthermore, the cracks may be generated with reduced heating time and/or heating temperature.

In accordance with some embodiments of the present disclosure, a method comprises implanting a substrate with a dopant to form an implanted layer in the substrate, wherein the implanted layer is at an intermediate level between a top surface and a bottom surface of the substrate; projecting a laser beam on the implanted layer, wherein the laser beam is projected on a sidewall of the substrate; and after the laser beam is projected, heating the substrate to separate the substrate at the implanted layer, and wherein the substrate is cut into a top portion and a bottom portion. In an embodiment, the laser beam results in a notch ring to be generated in the substrate, and wherein the notch ring extends from the sidewall of the substrate laterally into the substrate.

In an embodiment, in a cross-sectional view of the substrate, the notch ring has a tip pointing to a center of the substrate. In an embodiment, the implanted layer comprises a middle portion having a highest dopant concentration of the dopant; an upper portion over the middle portion; and a lower portion under the middle portion, wherein the upper portion and the lower portion have lower dopant concentrations than the middle portion, and wherein the laser beam is projected on the middle portion. In an embodiment, at a time the heating the substrate is started, the portion of the substrate that has received the laser beam remains, and a stress concentration region has been formed as a part of the substrate. In an embodiment, the substrate is cut at the stress concentration region.

In an embodiment, the substrate has a single crystalline structure. In an embodiment, the substrate is comprised in a top wafer, and the method further comprises bonding the top wafer to a bottom wafer. In an embodiment, after the substrate is cut, the bottom portion of the substrate remains to be bonded to the bottom wafer. In an embodiment, the method further comprises planarizing the bottom portion of the substrate. In an embodiment, the method further comprises, after the bottom portion of the substrate is planarized, patterning the bottom portion of the substrate to form photonic devices. In an embodiment, the substrate comprises a silicon substrate. In an embodiment, the substrate comprises a lithium niobate substrate.

In accordance with some embodiments of the present disclosure, a method comprises implanting a substrate with a dopant to form an implanted layer in the substrate, wherein the implanted layer is at an intermediate level between a top surface and a bottom surface of the substrate; cutting the substrate to form a notch, wherein the notch extends into the implanted layer; and after the notch is formed, heating the substrate to separate the substrate at the notch.

In an embodiment, the substrate is cut using a laser beam. In an embodiment, substrate is cut using a blade. In an embodiment, the method further comprises bonding the substrate to a bottom wafer to form a composite wafer; and rotating the composite wafer, wherein the notch is formed at a same time the composite wafer is rotated.

In accordance with some embodiments of the present disclosure, a method comprises bonding a top wafer to a bottom wafer, wherein the top wafer comprises a substrate, and wherein the substrate comprises an implanted layer comprising a dopant; forming a notch ring in the substrate, wherein the notch ring laterally extends into the implanted layer; and forming cracks starting from the notch ring, wherein the cracks propagate from the cracks laterally to separate the top wafer into a top portion and a bottom portion. In an embodiment, the notch ring is formed using a laser beam. In an embodiment, the notch ring is aligned to a portion of the implanted layer having a highest dopant concentration of the dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   implanting a substrate with a dopant to form an implanted layer in the substrate, wherein the implanted layer is at an intermediate level between a top surface and a bottom surface of the substrate;
   projecting a laser beam on the implanted layer, wherein the laser beam is projected on a sidewall of the substrate; and
   after the laser beam is projected, heating the substrate to separate the substrate at the implanted layer, and wherein the substrate is separated into a top portion and a bottom portion.

2. The method of claim 1, wherein the laser beam results in a notch ring to be generated in the substrate, and wherein the notch ring extends from the sidewall of the substrate laterally into the substrate.

3. The method of claim 2, wherein in a cross-sectional view of the substrate, the notch ring has a tip pointing to a center of the substrate.

4. The method of claim 1, wherein the implanted layer comprises:
   a middle portion having a highest dopant concentration of the dopant;
   an upper portion over the middle portion; and
   a lower portion under the middle portion, wherein the upper portion and the lower portion have lower dopant concentrations than the middle portion, and wherein the laser beam is projected on the middle portion.

5. The method of claim 1, wherein at a time the heating the substrate is started, the portion of the substrate that has received the laser beam remains, and a stress concentration region has been formed as a part of the substrate.

6. The method of claim 5, wherein the substrate is cut at the stress concentration region.

7. The method of claim 1, wherein the substrate has a single crystalline structure.

8. The method of claim 1, wherein the substrate is comprised in a top wafer, and the method further comprises bonding the top wafer to a bottom wafer.

9. The method of claim 8, wherein after the substrate is cut, the bottom portion of the substrate remains to be bonded to the bottom wafer.

10. The method of claim 8 further comprising planarizing the bottom portion of the substrate.

11. The method of claim 10 further comprising, after the bottom portion of the substrate is planarized, patterning the bottom portion of the substrate to form photonic devices.

12. The method of claim 1, wherein the substrate comprises a silicon substrate.

13. The method of claim 1, wherein the substrate comprises a lithium niobate substrate.

14. A method comprising:
   implanting a substrate with a dopant to form an implanted layer in the substrate, wherein the implanted layer is at an intermediate level between a top surface and a bottom surface of the substrate;

cutting the substrate to form a notch, wherein the notch extends into the implanted layer; and heating the substrate to separate the substrate at the notch.

15. The method of claim 14, wherein the substrate is cut using a laser beam.

16. The method of claim 14, wherein the substrate is cut using a blade.

17. The method of claim 14 further comprising:

bonding the substrate to a bottom wafer to form a composite wafer; and rotating the composite wafer, wherein the notch is formed at a same time the composite wafer is rotated.

18. A method comprising:

bonding a top wafer to a bottom wafer, wherein the top wafer comprises a substrate, and wherein the substrate comprises an implanted layer comprising a dopant;

forming a high-stressed region in the substrate, wherein the high-stressed region laterally extends into the implanted layer; and forming cracks starting from the high-stressed region, wherein the cracks propagate from the cracks laterally to separate the top wafer into a top portion and a bottom portion.

19. The method of claim 18, wherein the forming the high-stressed region comprises forming a notch ring using a laser beam.

20. The method of claim 18, wherein the forming the high-stressed region comprises forming a burned region using a laser beam.

\* \* \* \* \*